United States Patent [19]

Takahashi et al.

[11] Patent Number: 4,963,461
[45] Date of Patent: Oct. 16, 1990

[54] LIGHT-SENSITIVE MICROPCAPSULE AND LIGHT-SENSITIVE MATERIAL EMPLOYING THE SAME

[75] Inventors: Ryuichi Takahashi; Yoshiharu Yabuki, both of Kanagawa, Japan

[73] Assignee: Fuji Photo Film Co., Ltd., Kanagawa, Japan

[21] Appl. No.: 252,462

[22] Filed: Oct. 3, 1988

[30] Foreign Application Priority Data

Oct. 2, 1987 [JP] Japan .................................. 62-249365
Dec. 11, 1987 [JP] Japan .................................. 62-313486

[51] Int. Cl.$^5$ .............................................. G03C 1/72
[52] U.S. Cl. ............................... 430/138; 428/402.21; 503/215
[58] Field of Search ....................... 430/138; 503/215; 428/402.21

[56] References Cited

U.S. PATENT DOCUMENTS

| | | | |
|---|---|---|---|
| 4,100,103 | 7/1978 | Foris et al. | 503/215 |
| 4,711,749 | 12/1987 | Kosaka et al. | 424/497 |
| 4,772,531 | 9/1988 | Tsukahara, et al. | 430/138 |
| 4,778,781 | 10/1988 | Washizu et al. | 428/402.21 |

Primary Examiner—Paul R. Michl
Assistant Examiner—Thomas R. Neville
Attorney, Agent, or Firm—Sughrue, Mion, Zinn, Macpeak & Seas

[57] ABSTRACT

A light-sensitive microcapsule comprises a core material containing a silver halide and an ethylenically unsaturated polymerizable compound and a shell containing a melamine derivative-aldehyde resin which encloses the core material. The melamine derivative-aldehyde resin forming the shell is produced from formaldehyde and a melamine compound which contains a specifically selected melamine derivative in an amount of at least 10 wt. %. A light-sensitive material prepared using the microcapsule is also disclosed.

22 Claims, No Drawings

LIGHT-SENSITIVE MICROPCAPSULE AND LIGHT-SENSITIVE MATERIAL EMPLOYING THE SAME

FIELD OF THE INVENTION

The present invention relates to a light-sensitive microcapsule and a light-sensitive material prepared using the same. More particularly, the invention relates to an improvement of a light-sensitive microcapsule having a shell containing a melamine-aldehyde polycondensate resin and a light-sensitive material prepared using the same.

BACKGROUND OF THE INVENTION

A light-sensitive material having a light-sensitive layer containing silver halide, a reducing agent and a polymerizable compound provided on a support can be used in an image forming method in which a latent image of silver halide is formed, and then the polymerizable compound is polymerized to form the corresponding image.

Examples of said image forming methods are described in Japanese Patent Publication Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publications Nos. 57(1982)-138632, 57(1982)-142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (corresponding to U.S. Pat. No. 4,547,450) and 58(1983)-169143. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore, the process takes a relatively long time.

An improved image forming method employing a dry process is described in Japanese Patent Provisional Publications Nos. 61(1986)-69062 and 61(1986)-73145 (the contents of both publications are described in U.S. Pat. No. 4,629,676. In this image forming method, a recording material (i.e., light-sensitive material) comprising a support and a light-sensitive layer provided thereon which contains a light-sensitive silver salt (i.e., silver halide), a reducing agent, a cross-linkable compound (i.e., polymerizable compound) and a binder is imagewise exposed to form a latent image, and then the material is heated to polymerize within the area where the latent image of the silver halide has been formed. The above method utilizing the dry process and the light-sensitive material employable for such method are also described in Japanese Patent Provisional Publications Nos. 61(1986)-183640, 61(1986)-188535 and 61(1986)-228441.

The above-mentioned image forming methods are based on the principle in which the polymerizable compound is polymerized in the portion where a latent image of the silver halide has been formed.

Further, Japanese Patent Provisional Publication No. 61(1986)-260241 describes another image forming method in which the polymerizable compound in a portion where a latent image of the silver halide has not been formed is polymerized. In the method, when the material is heated, the reducing agent functions as polymerization inhibitor in the portion where a latent image of the silver halide has been formed, and the polymerizable compound in other portion is polymerized.

Japanese Patent Provisional Publications Nos. 61(1986)-275742 and 61(1986)-278849 describe an embodiment of the light-sensitive material, which employs microcapsules containing at least two components composing the light-sensitive layer, that is, a polymerizable compound and a color image forming substance. The light-sensitive material having such structure has an advantage of giving an image of high quality. The silver halide is generally contained in the microcapsules for the purpose of image formation in high sensitivity.

In the above-mentioned light-sensitive material employing the microcapsules, a shell of the microcapsule preferably has high strength (firmness) and high denseness from the viewpoints of enhancement of preservability of the light-sensitive material and easiness in handling thereof. The above publications also describe preferred examples of the shell materials for the microcapsules such as a polyurea resin and a polyurethane resin, or a urea/formaldehyde resin. Further, a variety of shell materials for the microcapsules are also proposed in various publications such as Japanese Patent Provisional Publications Nos. 62(1987)-209437, 62(1987)-209438, 62(1987)-209439, 62(1987)-209440, 62(1987)-209441, 62(1987)-209447 and 62(1987)-209442. Particularly, an amino-aldehyde resin described in the Japanese Patent Provisional Publication No. 62(1987)-209439 is very excellent in firmness and denseness.

In the light-sensitive materials having the above-mentioned constitution, a variety of other substances for accelerating image information such as base and base precursor (referred to as "image formation accelerator") are generally contained in the light-sensitive layer (not in the microcapsules). However, the present inventors have found that the effect given by incorporation of the image formation accelerator is not sufficiently shown when an image is formed using the above light-sensitive material containing the microcapsules of high denseness.

SUMMARY OF THE INVENTION

It is an object of the present invention to provide a light-sensitive microcapsule which has a shell having satisfactorily balanced property between the firmness or denseness and substance-permeability (i.e., permeability for such substance as an image-formation accelerator to permeate the shell).

It is another object of the invention to provide a light-sensitive material which gives a clear image even in a developing process for a short period of time.

There is provided by the present invention a light-sensitive microcapsule having a core material which contains a silver halide and an ethylenically unsaturated polymerizable compound and is enclosed with a shell comprising a melamine derivative-aldehyde resin produced from formaldehyde and a melamine compound containing a melamine derivative of the following formula (I) or (II) in an amount of at least 10 wt. %:

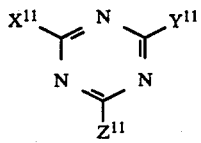

in which each of $X^{11}$, $Y^{11}$ and $Z^{11}$ independently is a group selected from the group consisting of amino, a substituted amino group of —$NHR^{11}$ or —$NR^{12}R^{13}$ wherein $R^{12}$ and $R^{13}$ is the same as or different from each other, hydrogen, an alkyl group, an alkoxy group, phenyl, benzyl, an alkoxycarbonyl group, an alkoxysulfonyl group, glucoside, a cyclic lactam group, nitro, pyrrolyl and indolyl; each of $R^{11}$, $R^{12}$ and $R^{13}$ is a group which is inert to aldehyde;

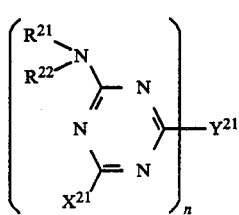

in which each of $R^{21}$ and $R^{22}$ is one atom or one group selected from the group consisting of hydrogen an alkyl group, an aryl group, a cycloalkyl group and an aralkyl group, provided that one of $R^{21}$ and $R^{22}$ is hydrogen; $X^{21}$ is —$NR^{23}R^{24}$ or —$OR^{25}$ wherein each of $R^{23}$, $R^{24}$ and $R^{25}$ has the same meaning as that of $R^{21}$; $Y^{21}$ is such an organic linking group that the number of atoms linking any two sets of the triazine rings is at least four; n is an integer of 2 to 4; and each of the above groups may have one or more substituents.

There is also provided by the present invention a light-sensitive material comprising a support and a light-sensitive layer provided thereon which contains a silver halide, a reducing agent and an ethylenically unsaturated polymerizable compound, at least said polymerizable compound being contained in a microcapsule, wherein said microcapsule has a shell comprising a melamine derivative-aldehyde resin produced from formaldehyde and a melamine compound which contains a 2-5 functional melamine derivative having the formula (I) or a melamine derivative having the formula (II), in an amount of at least 10 wt. %.

The light-sensitive microcapsule of the invention has a resin shell comprising a melamine derivative-aldehyde resin, so that the microcapsule not only keeps high denseness and high firmness at room temperature but also shows high substance-permeability (also referred to simply as "permeability") at high temperature in heating process because of its advantageous heat softening property of the resin.

More in detail, the polycondensation resin of the melamine derivative and formaldehyde is a polymer of three-dimensional network produced from both components, and hence a shell made of the resin shows high denseness and high firmness. In the microcapsule shell formed using the 2-5 functional melamine derivative of the formula (I), the number of cross-linking points of the network structure is smaller than that of a shell of melamine resin using only melamine (6-functional). Such microcapsule shell has a heat softening property higher than thermosetting resins such as a melamine resin and easily swells or expands so that it shows high permeability.

In the microcapsule shell formed using the melamine derivative of the formula (II) wherein a plurality of triazine rings are linked, the melamine derivative has a relatively long molecular chain (plural triazine rings are linked by means of atoms of single bond), so that the shell has a high heat softening property and easily swells or expands. Such microcapsule shell also shows higher permeability than the melamine resin using only melamine (i.e., thermosetting resin).

Moreover, the microcapsule formed using a melamine compound containing the above-mentioned melamine derivative of the formula (I) or (II) in the specific amount is further enhanced in the firmness. The terms "melamine compound" used herein means to contain the melamine derivative alone or a mixture of melamine and the melamine derivative.

In the light-sensitive material of the present invention, the microcapsule shows high preservability at room temperature and shows high permeability in the heat developing process as described above. Accordingly, a variety of image formation accelerators such as base precursor can readily move through the shell and participate in the expected polymerization reaction of the polymerizable compound, whereby the inherent function of the image formation accelerator is sufficiently shown and image formation can be efficiently carried out.

DETAILED DESCRIPTION OF THE INVENTION

One of the melamine derivative employable for the light-sensitive microcapsule of the present invention is a 2-5 functional melamine derivative having the formula (I):

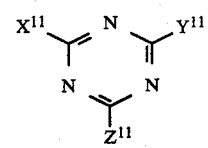

In the formula (I), each of $X^{11}$, $Y^{11}$ and $Z^{11}$ is a group selected from the group consisting of amino, a substituted amino group of —$NHR^{11}$ or —$NR^{12}R^{13}$ (each of $R^{11}$, $R^{12}$ and $R^{13}$ is a group which is inert to aldehyde such as an alkyl group having 1-6 carbon atoms, phenyl, an alkoxy group, an alkoxycarbonyl group and an alkoxysulfonyl group) wherein $R^{12}$ and $R^{13}$ may be the same as or different from each other, hydrogen, an alkyl group, an alkoxy group, phenyl, benzyl, an alkoxycarbonyl group, an alkoxysulfonyl group, glucoside, a cyclic lactam group, nitro, pyrrolyl and indolyl;

The above substituent groups, $X^{11}$, $Y^{11}$ and $Z^{11}$ in the formula (I) are under the following conditions according to functionality of the melamine derivative.

(1) In the case of a bifunctional melamine derivative, any one of $X^{11}$, $Y^{11}$ and $Z^{11}$ is amino, or any two of $X^{11}$, $Y^{11}$ and $Z^{11}$ is a substituted amino group (—$NHR^{11}$).

(2) In the case of a trifunctional melamine derivative, any one of $X^{11}$, $Y^{11}$ and $Z^{11}$ is amino and any one of the remaining groups is a substituted amino group (—$NHR^{11}$), or each of $X^{11}$, $Y^{11}$ and $Z^{11}$ is a substituted amino group (—$NHR^{11}$).

(3) In the case of a tetrafunctional melamine derivative, any two of $X^{11}$, $Y^{11}$ and $Z^{11}$ is amino, or any one of $X^{11}$, $Y^{11}$ and $Z^{11}$ is amino and both of the remaining two groups are a substituted amino group ($-NHR^{11}$).

(4) In the case of a pentafunctional melamine derivative, any two of $X^{11}$, $Y^{11}$ and $Z^{11}$ is amino and the remaining one is a substituted amino group ($-NHR^{11}$).

In the present invention, the melamine derivative preferably is pentafunctional (the above embodiment (4)) or tetrafunctional (the above embodiment (3)).

The above-mentioned tetrafunctional melamine derivative is preferably guanamine (that is, two of $X^{11}$, $Y^{11}$ and $Z^{11}$ are amino group).

Another melamine derivative also employable for the light-sensitive microcapsule of the present invention is a melamine derivative having the formula (II):

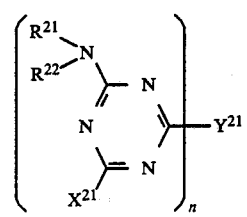

(II)

In the formula (II), each of $R^{21}$ and $R^{22}$ independently is an atom or a group selected from the group consisting of hydrogen, alkyl, aryl, cycloalkyl group and aralkyl, and any one of $R^{21}$ and $R^{22}$ is hydrogen. Preferred alkyl group (including alkyl of cycloalkyl group or aralkyl group) is a lower alkyl group having 1-6 carbon atoms. Preferred aryl group is phenyl. $X^{21}$ in the formula (II) is $-NR^{23}R^{24}$ or $-OR^{25}$ wherein each of $R^{23}$, $R^{24}$ and $R^{25}$ has the same meaning as that of $R^{21}$ (or $R^{22}$), and each of $R^{21}$, $R^{22}$, $R^{23}$ and $R^{24}$ is preferably hydrogen. $Y^{21}$ in the formula (II) is such an organic linking roup or residual group that the number of atoms linking any optional two sets of the triazine rings is at least four. "n" in the formula (II) is an integer of 2 to 4. Examples of the substituted groups of the above-mentioned each group include. hydroxyl, an alkyl group having 1-6 carbon atoms, an alkoxy group having 1-6 carbon atoms, an aryloxy group, an dialkylamino group (each alkyl has 1-6 carbon atoms), an aryl group, an alkylthio group (alkyl has 1-6 carbon atoms) and an arylthio group.

In the melamine derivative having the above formula (II), the atoms which are contained in the traizine ring-linking group ($Y^{21}$) as terminal groups to attach to the triazine rings preferably area atoms selected from the group consisting of nitrogen, oxygen and sulfur. The organic linking group indicated by $Y^{21}$ in the formula (II) is preferably constituted of the above-mentioned atoms and one or more methylene group (the methylene group may have a substituent group).

Further, in the formula (II), it is preferred that $X^{21}$ is $-NR^{23}R^{24}$; n is 2; and $Y^{21}$ is an organic linking group in which the number of atoms linking the two triazine rings is not more than 14.

Examples of the above-described melamine derivatives having the formula (II) are as follows.

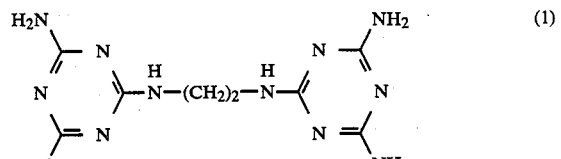

(1)

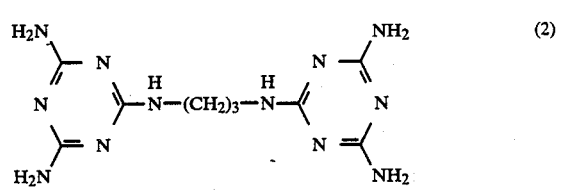

(2)

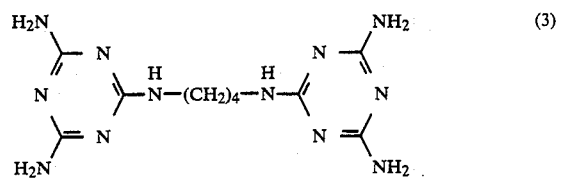

(3)

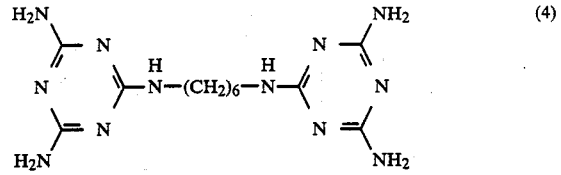

(4)

-continued
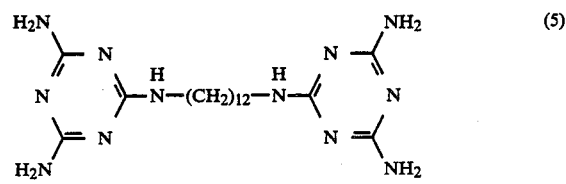
(5)
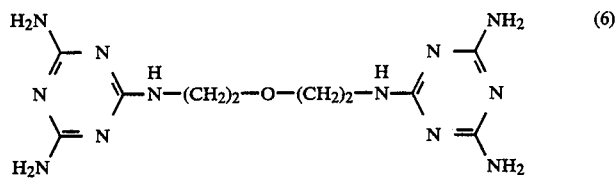
(6)
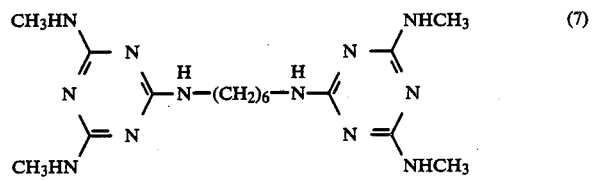
(7)
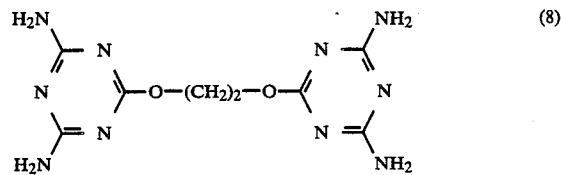
(8)
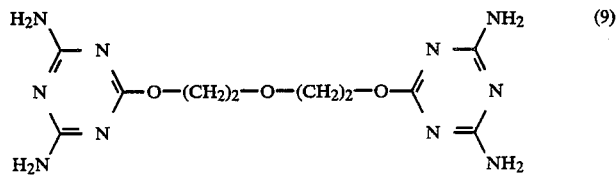
(9)
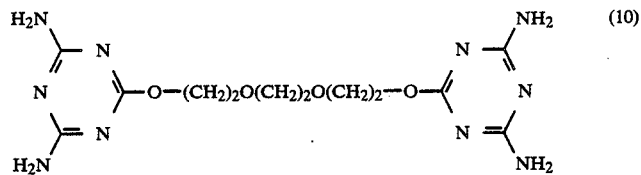
(10)
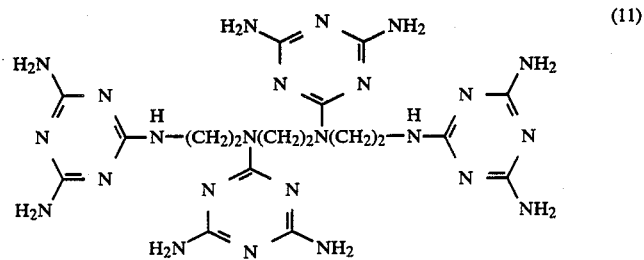
(11)
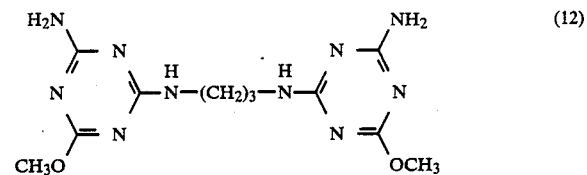
(12)

-continued
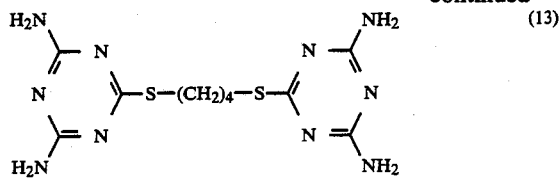
(13)
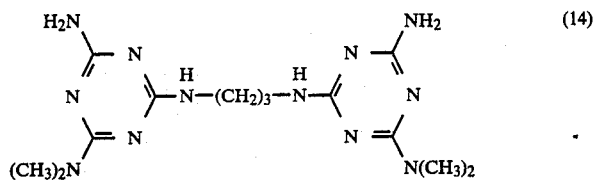
(14)
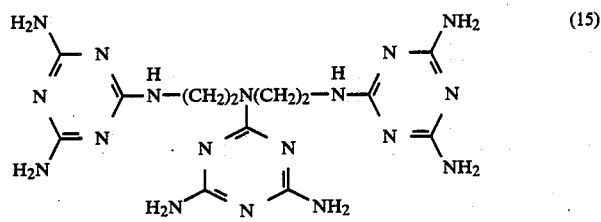
(15)
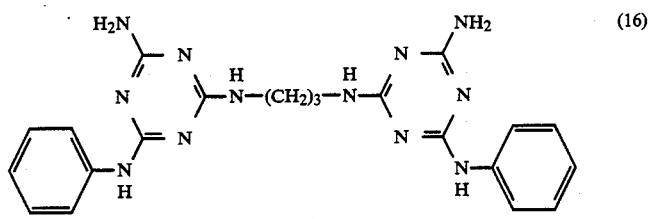
(16)
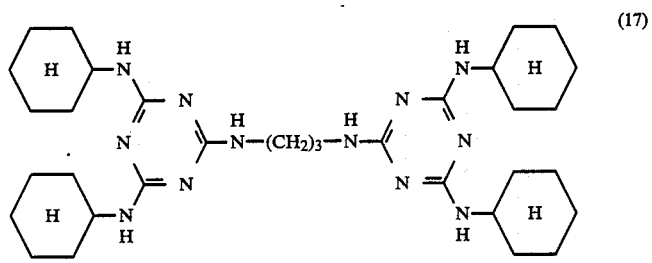
(17)
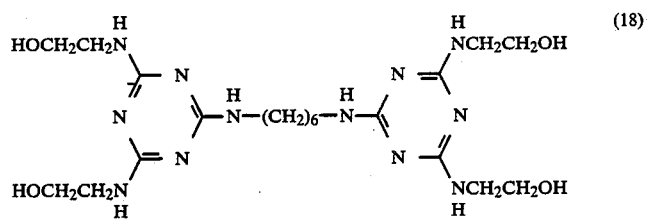
(18)
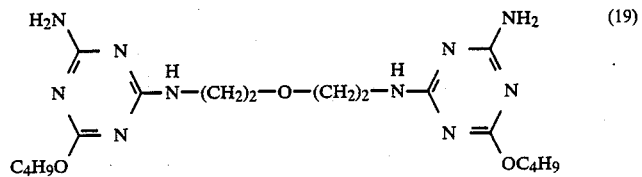
(19)
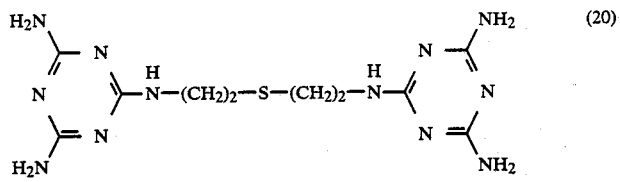
(20)

-continued
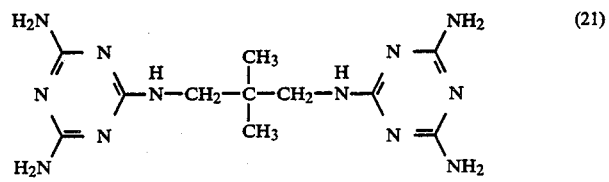 (21)
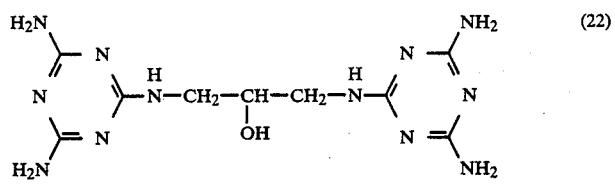 (22)
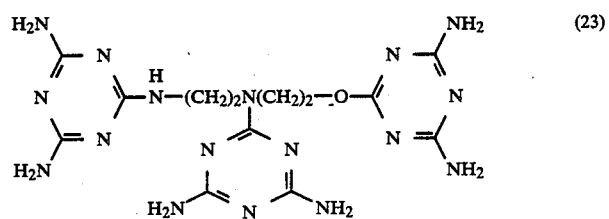 (23)
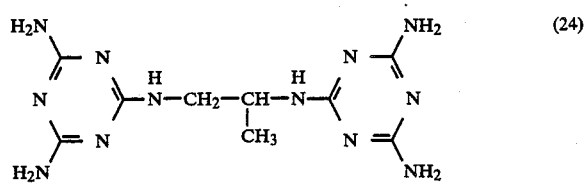 (24)
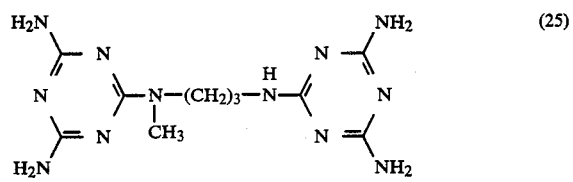 (25)
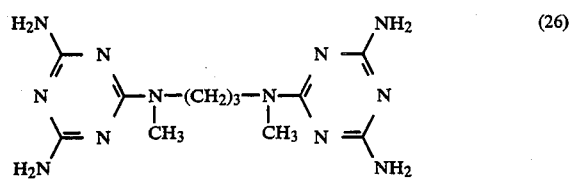 (26)
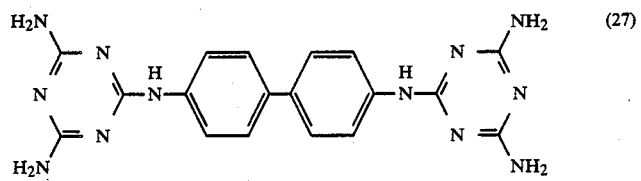 (27)
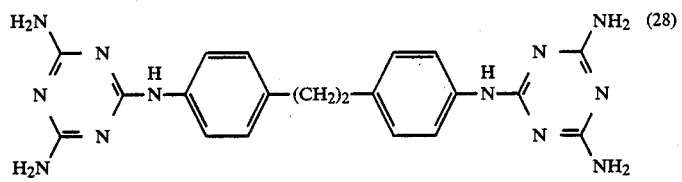 (28)

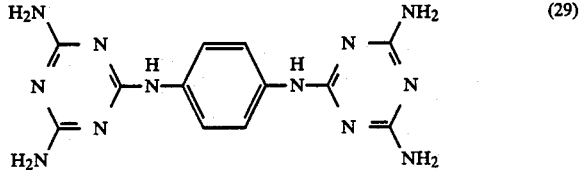

(29)

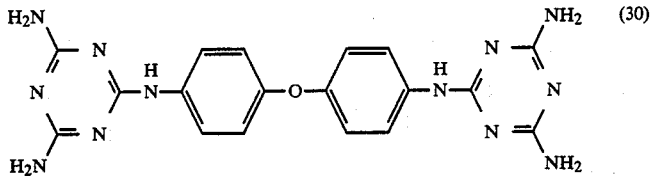

(30)

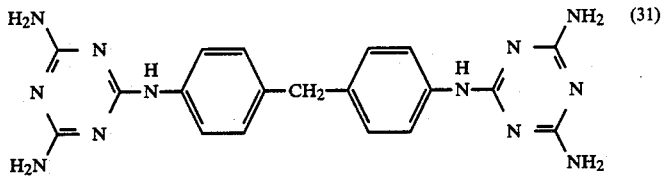

(31)

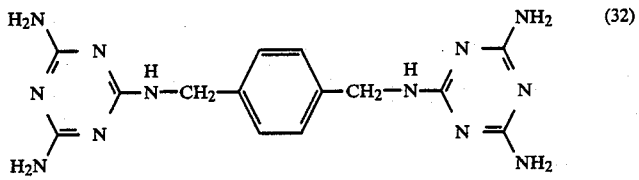

(32)

The above-exemplified melamine derivatives can be prepared, for example, by the following process. The process for the preparation of the above compound (6) will be described below.

Preparation of Compound (6)

In a suspension of 305.6 g of 2,4-diamino-6-chloro-S-triazine, 104 g of $\beta,\beta'$-diaminodiethyl ether and 2 l of water was dropped 84.4 g of an aqueous solution of sodium hydroxide keeping pH of the suspension in the vicinity of neutrality (indicator: phenolphthalein) under heating in a water bath. After the alkali was completely consumed, the resulting mixture was filtered to remove insolubles. The filtrate was then cooled to precipitate white crystals (melamine derivative). Thus cooled filtrate was again filtered to obtain the desired melamine derivative (yield: 353.1 g).

A variety of melamine derivatives such as the above-mentioned compounds can be easily synthesized according to processes described in "Journal of the American Chemical Society", J. R. Dudley, J. T. Thurston, et al., 73, 2981(1951), 73, 2984(1951), 73, 2986(1951).

The process for the preparation of the light-sensitive microcapsule of the present invention using the above-described melamine derivative is now described in detail hereinafter.

A hydrophobic liquid of core material (referred to hereinafter as "light-sensitive composition") comprising a light-sensitive silver halide and a polymerizable compound, and if desired, a reducing agent and an image formation substance is emulsified and dispersed in an aqueous medium containing at least one kind of an anionic protective colloid. The core material such as the silver halide will be described later. Then, to the resulting emulsion is added the above-described melamine derivative-formaldehyde precondensate to cause polymerization around the oily droplets of core material under adjustment of reaction conditions such as pH and a temperature, so as to form microcapsule shell of melamine derivative-aldehyde resin.

In the above-mentioned reaction for the shell formation, an anionic protective colloid is generally used. The employment of the anionic protective colloid makes it possible to disperse fine droplets of hydrophobic liquid in an aqueous medium and further makes it possible to prevent the dispersed droplets from aggregation of unification. Accordingly, the anionic protective colloid is previously incorporated into the aqueous medium. Appropriate materials for the formation of anionic protective colloids for such a purpose are anionic polymers, which are exemplified by polystyrenesulfonate, styrene copolymers, polyvinylsulfonate ester salts, polyvinylsulfonates, maleic anhydride-styrene copolymer, maleic anhydride-isobutylene copolymer, maleic anhydride-ethylene copolymer, maleic anhydride-methyl vinyl ether copolymer, polyvinyl alcohol (saponified product), carboxymethyl-modified polyvinyl alcohol, gum arabic, polyacrylates, polyacrylate derivatives, acrylate copolymers, carboxymethyl cellulose, gelatin, pectin, pullulan, phthalated gelatin, succinated gelatin, other gelatin derivatives, cellulose sulfate ester salt, alginic acid, and mixtures thereof.

There are known processes for the preparation of a melamine-aldehyde resin, and the known processes can be utilized in the preparation of the light-sensitive microcapsule having the melamine derivative-aldehyde resin shell according to the invention.

There are further known processes for the preparation of microcapsules by forming melamine resin shells around small droplets of a hydrophobic liquid dispersed in an aqueous medium. Examples of such known processes are described in Japanese Patent Provisional Publications Nos. 55(1980)-15660, 55(1980)-47139 and 56(1981)-51238, and U.S. Pat. Nos. 4,100,103 and 4,233,178. These known processes can be also utilized in the present invention.

The microcapsule shell prepared as above comprises formaldehyde and a melamine compound which contains the above-mentioned melamine derivative in an amount of at least 10 wt. %. That is, the shell is made of a melamine derivative-formaldehyde resin (including a co-condensation product) produced from the above melamine derivative (or a melamine compound containing the above melamine derivative and melamine) and formaldehyde. The co-condensation shell can be also prepared by the similar process to the above-described one. In detail, the hydrophobic liquid is dispersed and emulsified in an aqueous medium to prepare an emulsion, and then to the emulsion are simultaneously added a melamine derivative-formaldehyde precondensate and a melamine-formaldehyde precondensate which is separately prepared under adjustment of the reaction conditions such as pH and a temperature. The melamine compound preferably contains the melamine derivative in an amount of at least 50 wt. %. The melamine derivative employed for the formation of the co-condensation shell preferably is pentafunctional. In the case that the shell is a co-condensation shell, the firmness thereof is further enhanced at room temperature as compared with a shell containing the melamine derivative alone.

Almost of all grains of the silver halide may be present inside of the core material, or a portion thereof may be present in the vicinity of the interface between the core material and the shell in the buried state.

For the incorporation of silver halide and polymerizable compound into the hydrophobic liquid for the preparation of the core material, the silver halide is generally incorporated first into an aqueous medium for the preparation of a silver halide emulsion and then the emulsion is mixed with a hydrophobic solvent. The aqueous medium of the silver halide emulsion is moved at a later stage into an aqueous medium employed for the preparation of the microcapsules. Thus, there is brought little water into the core of the obtained microcapsule. Simultaneously with the movement of water, silver halide grains move from the inside of the core material phase (oily phase) to the dispersion medium phase (aqueous phase), whereby not a small amount of silver halide grains gather in the vicinity of the interface between the core material phase and the dispersing medium phase. Accordingly, the silver halide grains are apt to be present in the vicinity or even within the shell at high concentration, if the silver halide is incorporated into the core material using a silver halide emulsion. Such localized distribution of silver halide grains does not adversely affect the property of the light-sensitive capsule, and it is probable that such distribution is preferable in enhancement of the sensitivity.

The silver halide grains can be incorporated into the core material by other methods than the method using a silver halide emulsion. For instance, a dispersion containing silver halide grains dispersed in an organic solvent can be utilized for the incorporation. Alternatively, a powdery silver halide can be simply mixed with a polymerizable compound.

The light-sensitive microcapsule of the present invention preferably has a composite shell (i.e., a double-layered shell) including an inner shell made of polyurea resin and/or polyurethane resin. In this case, the silver halide grains can be firmly contained in the microcapsule without running into the aqueous phase.

The above-mentioned inner shell made of polyurea resin and/or polyurethane resin can be prepared, for example, in the following manner.

Prior to the formation of the melamine derivative-aldehyde resin shell (outer shell), a polyisocyanate compound is dissolved in a hydrophobic liquid. Then, the resulting solution is dispersed in an aqueous medium containing a polyamine compound and/or a polyol compound and a dispersing agent to form a dispersion containing small droplets of the hydrophobic core material, wherein the dispersion preferably contains a catalyst for accelerating polycondensation reaction between the polyisocyanate compound and the polyamine compound and/or the polyol compound. The dispersion prepared as above is heated at 40°–90° C. to form an inner shell of a polyurea resin (reaction product of the polyisocyanate compound and the polyamine compound or water) and/or a polyurethane resin (reaction product of the polyisocyanate compound and the polyol compound).

In the present invention, the terms "polyurea resin" and "polyurethane resin" are not construed to indicate polymers containing, respectively, the urea bondings only or the urethane bondings only. For instance, the polyurethane resin include a polyurethane resin in which certain portions of the urethane bondings are replaced with urea bondings. This is also applied to the polyurea resin.

A number of processes for the preparation of microcapsules having a shell of a polyurea resin, a polyurethane resin and a mixture thereof are known. These processes can be also applied to the preparation of the light-sensitive microcapsule of the invention.

As a shell forming process, there can be also utilized those described in Japanese Patent Provisional Publications Nos. 56(1981)-102935 and 56(1981)-144739.

Thus, a light-sensitive microcapsule having a double layered shell comprising an inner shell of a polyurea resin and/or a polyurethane resin and an outer shell of a melamine derivative-aldehyde resin can be obtained. The shell prepared as above basically is a double layered shell, but the double layered shell does not necessarily have a distinct boundary between the inner shell and the outer shell, and it is enough that the outer surface of the whole shell and the vicinity thereof are substantially made of a melamine derivative-aldehyde resin and the inner surface of the whole shell and the vicinity thereof are substantially made of a polyurea resin and/or a polyurethane resin.

By the provision of the inner shell as described above, the resulting microcasule is further enhanced as a whole in the denseness and the firmness. Moreover, the polyurea resin and/or the polyurethane resin composing the inner shell has high heat softening properties, so that the resulting microcapsule can keep high permeability without being deteriorated in the swell properties of the melamine derivative-aldehyde resin shell, even if the microcapsule had a double layered shell.

Examples of polyisocyanate, polyamine and polyol employable for the preparation of the inner shell are described, for instance, in the aforementioned Japanese Patent Provisional Publication No. 61(1986)-275742.

The light-sensitive microcapsules prepared in the above-described manners can be separated from the aquoues medium by known separation methods such as evaporation, filtration and centrifugal separation.

The means size of the microcapsules preferably ranges from 0.5 to 50 $\mu$m, more preferably 3 to 20 $\mu$m.

The amount of the microcapsules having a particle size of not larger than one sixth part of the average particle size preferably is not more than 10 volume % of the total amount of the microcapsules. Further, the amount of the microcapsules having a particle size of not smaller than twice as large as the average grain size is not more than 10 volume % of the total amount of the microcapsules. Further more, the proportion of an average thickness of the shell of the microcapsules to the average grain size preferably ranges from $0.5 \times 10^{-2}$ to $5 \times 10^{-2}$.

In the case of incorporating a silver halide into the microcapsule, the average grain size of the silver halide preferably is not more than 1/5, more preferably not more than 1/10, of the average particle size of the microcapsules. When the average size of the silver halide grains is not more than 1/5 of the average particle size of the microcapsules, an even and uniform image can be obtained.

A light-sensitive material of the present invention will be described below.

The light-sensitive material comprises a support and a light-sensitive layer provided thereon which contains a silver halide, a reducing agent and the aforementioned polymerizable compound, at least said polymerizable compound among which is contained in the microcapsule in the light-sensitive layer.

There is no specific limitation with respect to the silver halide contained in the light-sensitive layer of the light-sensitive material. Examples of the silver halides include as silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos. 57(1982)-154232, 58(1983)-108533, 59(1984)-48755 and 59(1984)-52237, U.S. Pat. No. 4,433,048, and European Patent No. 100,984) can be employed. A silver halide grain having a core/shell structure in which the silver iodide content in the shell is higher than that in the core can be also employed.

There is no specific limitation on the crystal habit of silver halide grains. For example, a tubular grain having an aspect ratio of not less than 3 can be used.

The silver halide grains preferably have such a relatively low tendency to be fogged that the amount of developed silver is not more than 5 weight % based on the total amount of silver when the unexposed silver halide grains are developed in 1 l of an aqueous developing solution containing 1.0 g of metol, 15.0 g of sodium sulfite, 4.0 g of hydroquinone, 26.7 g of sodium carbonate monohydrate and 0.7 g of potassium bromide.

Two or more kinds of silver halide grains which differ in halogen composition, crystal habit, grain size, and/or other features from each other can be used in combination.

There is no specific limitation on grain size distribution of silver halide grains. For example, the silver halide grains having such a grain size distribution that the coefficient of the variation is not more than 20% can be employed.

The silver halide grains ordinarily have a mean grain (or particle) size of 0.001 to 5 $\mu$m, more preferably 0.001 to 2 $\mu$m.

The total silver content (including silver halide and an organic silver salt which is one of optional components) in the light-sensitive layer preferably is in the range of from 0.1 mg/m$^2$ to 10 g/m$^2$. The silver content of the silver halide in the light-sensitive layer preferably is not more than 1 g/m$^2$, more preferably in the range of from 1 mg to 500 mg/m$^2$.

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound within either an area where a latent image of the silver halide has been formed or an area where a latent image of the silver halide has not been formed can be polymerized. In the developing system in which the polymerizable compound within the area where the latent image has not been formed is polymerized, 1-phenyl-3-pyrazolidone is preferably employed as the reducing agent.

The light-sensitive materials employing the reducing agent having these functions (including compounds referred to as developing agent, hydrazine derivative or precursor of reducing agent) are described in Japanese Patent Provisional Publications Nos. 61(1986)-183640, 61(1986)-188535 and 61(1986)-228441. These reducing agents are also described in T. James, "The Theory of the Photographic Process", 4th edition, pp. 291-334 (1977), Research Disclosure No. 17029, pp. 9-15 (June 1978), and Research Disclosure No. 17643, pp. 22-31 (Dec. 1978). The reducing agents described in the these publications can be employed in the light-sensitive material of the present invention. Thus, "the reducing agent(s)" in the present specification means to include all of the reducing agents described in the above mentioned publications and applications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)-butyloyl}-2-(p- or o-aminophenyl)hydrazine, 1-{2-(2,5-di-t-pentylphenoxy)butyloyl}-2-(p- or o-aminophenyl)-hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p- or o-methoxyphenyl)hydrazine, 1-(methoxycarbonylbenzohydryl)-2-phenylhydrazine, 1-formyl-2-[4-{2-(2,4-di-tert-pentylphenoxy)-butylamide}phenyl]hydrazine, 1-acetyl-2-[4-{2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine and 1-trityl-2-[{2-(N-ethyl-N-octylsulfamoyl)-4-methanesulfonyl}phenyl]hydrazine.

The amount of the reducing agent in the light-sensitive layer preferably ranges from 0.1 to 1,500 mole % based on the amount of silver (contained in the above-mentioned silver halide and an organic silver salt).

There is no specific limitation with respect to the polymerizable compound, except that the compound has an ethylenically unsaturated group. Any known ethylenically unsaturated polymerizable compounds including monomers, oligomers and polymers can be contained in the light-sensitive layer. In the case that heat development (i.e., thermal development) is utilized for developing the light-sensitive material, a polymerizable compounds having a relatively higher boiling point (e.g., 80° C. or higher) is preferably employed, because it is hardly evaporated upon heating. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds. Further, in the case that a transferred image is formed on an image-receiving material, the polymerizable compound preferably has a viscosity of not lower than 100 cP at 25° C.

Examples of compounds having an ethylenically unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

The light-sensitive material can be prepared by arranging a light-sensitive layer containing the above-mentioned components on a support. There is no limitation with respect to the support. In the case that a heat development is utilized in the use of the light-sensitive material, the support preferably is resistant to heat given in the processing stage. Examples of the material employable as the support include glass, paper, fine paper, coat paper, cast-coated paper, baryta paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene). In the case that a porous material such as paper is employed as the support, the porous support preferably has such a surface characteristic that a filtered maximum waviness of not less than 4 μm is observed in not more than 20 positions among 100 positions which are determined at random on a filtered waviness curve obtained according to JIS-B-0610. A surface of a paper support preferably has a low water absorptiveness of not more than 3 g/m$^2$ which is a value measured according to Cobb test method. A surface of the paper support preferably has such a smooth surface that the smoothness value in terms of the Bekk Smoothness is not less than 300 seconds. A paper support preferably has a low shrinkage ratio of not more than 0.15% both in the machine direction and in the cross direction, wherein the shrinkage ratio is a value measured at the change of relative humidity from 75% to 60%. Further, a paper support preferably has a low air permeability of not less than 300 seconds, wherein the air permeability is a time required for 100 ml of air to pass through the paper support of an area of 645 mm$^2$ at pressure of 567 g. Furthermore, a paper support preferably has a pH value in the range of 5 to 9.

Various embodiments of the light-sensitive materials, optional components which may be contained in the light-sensitive layer, and auxiliary layers which may be optionally arranged on the light-sensitive materials are described below.

The light-sensitive layer can further contain optional components such as color image forming substances, sensitizing dyes, organic silver salts, radical generators, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers, binders, photo polymerization initiator, solvent of the polymerizable compound and water soluble vinyl polymers.

In the light-sensitive material, a polymer image can be obtained on the support by polymerization. Further, a color image can be obtained on the support by incorporating a color image forming substance into the light-sensitive layer.

There is no specific limitation on the color image forming substance, and various kinds of substances can be employed. Examples of the color image forming substance include both colored substance (i.e., dyes and pigments) and non-colored or almost non-colored substance (i.e., color former or dye- or pigment- precursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145.

Examples of the dyes and pigments (i.e., colored substances) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), pp. 29–58 (pressure-sensitive copying paper), pp. 87–95 (azo-graphy), pp. 118–120 (heat-sensitive color formation by a chemical change) or in MSS. of the seminer promoted by the Society of Kinki Chemical Industry, "The Newest Chemistry of Coloring Matter—Attractive Application and New Development as a Functional Coloring Matter", pp. 26–32 (June, 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

The color image forming substance in the light-sensitive material is preferably used in an amount of from 0.5 to 20 parts by weight, and more preferably from 2 to 7 parts by weight, per 100 parts by weight of the polymerizable compound. In the case that the developer is used, the amount thereof is preferably in the range of approx. 0.3 to 80 parts by weight per one part by weight of the color former.

In the case that the color image forming substance comprises two components (e.g., color former and a developer), one component and the polymerizable compound is contained in the microcapsule, and the other component is arranged outside of the microcapsule in the light-sensitive layer, a color image can be formed on the light-sensitive layer.

There is no specific limitation with respect to the sensitizing dyes, and known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect of does not substantially absorb visible light but shows supersensitizing activity can be used. The amount of the sensitizing dye to be added generally ranges from about $10^{-8}$ to about $10^{-2}$ mol per 1 mol of silver halide.

The sensitizing dye is preferably added during the stage of the preparation of the silver halide emulsion.

In the heat-development process, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inoganic silver salt can be added to the light-sensitive layer to obtain the same effect.

The light-sensitive layer may further contain a radical generator which participates in polymerization accelerating reaction or polymerization restraining reaction of the aforementioned reducing agent. Examples of the radical generators include triazenesilver, silver diazotate and an azo compound.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into bases, base precursors, oils, surface active agents, compounds functioning as an antifogging agent and/or a development accelerator, hot-melt solvents, antioxidants and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

These bases or base precursors are preferably used in an amount of not more than 100% by weight, and more preferably from 0.1 to 40% by weight, based on the total solid content of the light-sensitive layer. These bases or base precursors can be used singly or in combination.

The base or base precursor can be arranged outside of the microcapsules containing the components of the light-sensitive layer, such as silver halide and polymerizable compound. In this case, the base or base precursor preferably is a hydrophobic compound having melting point of 80° to 180° C. in the form of solid particles.

A base precursor can be used in combination with a catalyst for decomposing the base precursor. For example, a propiolate type base precursor can be used in combination with a catalyst such as silver, copper, a silver compound and a copper compound. Further, the propiolate type base precursor or a sulfonylacetate type base precursor can be used in combination with a hot-melt solvent, which functions as a catalyst for decomposing the base precursor.

In the light-sensitive material, the silver halide, the reducing agent and the polymerizable compound are preferably contained in microcapsules and the base or base precursor is preferably arranged outside of the microcapsule in the light-sensitive layer. Further, the base or base precursor can be contained in different microcapsules from those containing the polymerizable compound. The base or base precursor can be contained in the microcapsules under the condition that the base or base precursor is dissolved or dispersed in an aqueous solution of a water retention agent, or under the condition that the base or base precursor is adsorbed on solid particles. The base or base precursor contained in the microcapsules preferably has a melting point in the range of 70° to 210° C.

The base or base precursor can be contained in a layer different from the light-sensitive layer. Further, the base or base precursor can be contained in a porous support.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator are used to give a clear image having a high maximum density and a low minimum density (an image having high contrast). Examples of the compounds include a 5- or 6-membered nitrogen containing heterocyclic compound (including a cyclic amide compound), a thiourea derivative, a thioether compound, a polyethylene glycol derivative, a thiol derivative, an acetylene compound, a sulfonamide derivative and a quarternary ammonium salt.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having $-SO_2-$ and/or $-CO-$ group described in U.S. Pat. No. 3,347,675; polar compounds described in U.S. Pat. No. 3,667,959; and 1,10-decanediol, methyl anisate and biphenyl suberate described in Research Disclosure pp. 26–28 (Dec. 1976). The hot-melt solvent is preferably used in an amount of from 0.5 to 50% by weight, and more preferably from 1 to 20% by weight, based on the total solid content of the light-sensitive layer.

The antioxidants can be used to eliminate the influence of the oxygen which has an effect of inhibiting polymerization in the development process. Example of the antioxidants is a compound having two or more mercapto groups.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", pp. 6-18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis-(1-cyclohexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, di-tert-butyl peroxide, dicumyl peroxide, tert-butyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. In a system in which the polymerizable compound within the area where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241.

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating, electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

Dyes or pigments can be contained in the light-sensitive layer for the purpose of anti-halation or anti-irradiation. Further, white pigments can be contained in the light-sensitive layer for the purpose of anti-halation or anti-irradiation.

The dyes having a property of being decolorized when it is heated or irradiated with light can be used in the light-sensitive material as a yellow filter layer in a conventional silver salt photographic system.

The antismudging agents employable in the light-sensitive material preferably are particles which are solid at ambient temperatures. Examples of the antismudging agents include starch particles described in U.K. Patent No. 1,232,347; polymer particles described in U.S. Pat. No. 3,625,736; microcapsule particles containing no color former described in U.K. Patent No. 1,235,991; and cellulose particles, and inorganic particles such as particles of talc, kaolin, and bentonite, agalmatolite, zinc oxide, titanium dioxide or alumina described in U.S. Pat. No. 2,711,375. Such particles preferably have a mean size of 3 to 50 μm, more preferably 5 to 40 μm. When the microcapsule is employed in the light-sensitive material, the size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination. The light-sensitive material employing a binder is described in Japanese Patent Provisional Publication No. 61(1986)-69062 (corresponding to U.S. Pat. No. 4,629,676 and European Patent Provisional Publication No. 0174634A2).

In the case that the solvent of the polymerizable compound is used, the solvent is preferably contained in a microcapsule which is different from the light-sensitive microcapsule.

In the case that the water soluble vinyl polymer is used, the polymers are preferably adsorbed on the silver halide grains.

Examples and usage of the other optional components which can be contained in the light-sensitive layer are also described in the above-mentioned publications and applications concerning the light-sensitive material, and in Research Disclosure Vol. 170, No. 17029, pp. 9-15 (June 1978). The light-sensitive layer preferably hhas a pH value of not more than 7.

Examples of auxiliary layers which are optionally arranged on the light-sensitive material include an image-receiving layer, a heating layer, an antistatic layer, an anticurl layer, a release layer, a cover sheet or a protective layer and an antihalation layer (colored layer).

Instead of the use of the image-receiving material, the image-receiving layer can be arranged on the light-sensitive material to produce the desired image on the image-receiving layer of the light-sensitive material. The image-receiving layer of the light-sensitive material can be constructed in the same manner as the layer of the image-receiving layer. The details of the image-receiving layer will be described later.

Examples and usage of the other auxiliary layers are also described in the above-mentioned publications and applications concerning the light-sensitive material.

The light-sensitive material of the invention can be prepared, for instance, by the following process.

The light-sensitive material is usually prepared by dissolving, emulsifying or dispersing each of the components of the light-sensitive layer in an adequate medium to obtain coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

Preparations of liquid compositions and coating solutions of the components contained in the light-sensitive layer are described hereinbelow.

The iridium salt is preferably introduced in the course of the stage of the preparation of the silver halide emulsion to obtain the silver halide grain containing iridium ion of the invention.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publications Nos. 55(1980)-142329 and 55(1980)-158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsion, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivative; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)-144319 can be used as a silver halide solvent. Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water soluble iridium salt, e.g., iridium (III) or (IV) chloride, or ammonium hexachloroiridate, or a water soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When the sensitizing dyes are added to the silver halide emulsion, the sensitizing dye is preferably added in the course of the preparation of the emulsion. When the aforementioned organic silver salts are introduced in the light-sensitive microcapsule, the emulsion of the organic silver salts can be prepared in the same manner as in the preparation of the silver halide emulsion.

In the preparation of the light-sensitive material, the polymerizable compound (the term, "polymerizable compound" includes the photo polymerizable composition and photo polymerizable compound) is used as a medium for preparation of the liquid composition containing another component of the light-sensitive layer, as described hereinbefore.

A light-sensitive composition which is a polymerizable compound containing the silver halide can be prepared, using the silver halide emulsion. Otherwise, a silver halide powder prepared by lyophylization can be also used other than the lilver halide emulsion to prepare the light-sensitive composition. The light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispered state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The light-sensitive composition can be also prepared by dispersing microcapsule containing silver halide emulsion as a core structure in the polymerizable compound instead of employing the above polymer.

Instead of employing the above polymer, the light-sensitive composition can be prepared by dispersing the microcapsule having the silver halide emulsion as core material in the emulsion of the polymerizable compound.

Using the light-sensitive composition, a dispersion of the microcapsules is prepared according to the above-mentioned encapsulization method. If desired, optional components can be added to the dispersion of microcapsule to prepare a coating solution. The coating solution is applied onto a support, and the coated layer of the solution is dried to prepare a light-sensitive material. The application of the coating solution on the support can be easily carried out by a conventional process.

Use of the light-sensitive material is described below.

In the use of the light-sensitive material of the invention, a development process is conducted simultaneously with or after an imagewise exposure.

Various exposure means can be employed in the imagewise exposure, and in general, the latent image on the silver halide is obtained by imagewise exposure to radiation including visible light. The type of light source and exposure can be selected depending on the light-sensitive wavelengths determined by spectral sensitization or sensitivity of silver halide. Original image can be either monochromatic image or color image.

Development of the light-sensitive material can be conducted simultaneously with or after the imagewise exposure. The development can be conducted using a developing solution in the same manner as the image forming method described in Japanese Patent Publication No. 45(1970)-11149. The image forming method described in Japanese Patent Provisional Publication No. 61(1986)-69062 which employs a heat development process has an advantage of simple procedures and short processing time because of the dry process. Thus, the latter method is preferred as the development process of the light-sensitive material.

Heating in the heat-development process can be conducted in various known manners. The heating layer which is arranged on the light-sensitive material can be used as the heating means in the same manner as the light-sensitive material described in Japanese Patent Provisional Publication No. 61(1986)-294434. The light-sensitive material is preferably heated while suppressing supply of oxygen into the light-sensitive layer from outside. Heating temperatures for the development process usually ranges from 80° C. to 200° C., and preferably from 100° C. to 160° C. Various heating patterns are applicable. The heating time is usually not shorter than 1 second, preferably from 1 second to 5 minutes, and more preferably from 1 second to 1 minute.

Instead of incorporating bases or base precursors into the light-sensitive material, the development can be carried out simultaneously or after adding the bases or base precursors to the light-sensitive layer. A base sheet (a sheet in which a base is contained) is preferably employed.

During the above development process, a polymerizable compound within the area where a latent image of the silver halide has been formed or within the area where a latent image of the silver halide has not been formed is polymerized. In a general system, the polymerizable compound within the area where the latent image has been formed is polymerized. If a nature or amount of the reducing agent is controlled, the polymerizable compound within the area where the latent image has not been formed can be polymerized.

A polymer image can be formed on the light-sensitive layer in the above process. A color image can be obtained by fixing a dye or pigment on a polymer image.

Further, a color image can be formed on the light-sensitive material in which the light-sensitive layer contains a color former and a developer, one of them is together with the polymerizable compound contained in a microcapsule, and the other is arranged outside of the microcapsule.

The image can be also formed on the image-receiving material. The image-receiving material is described hereinbelow.

Examples of the material employable as the support of the image-receiving material include baryta paper in addition to various examples which can be employed as the support of the known light-sensitive material. In the case that a porous material, such as paper is employed as the support of the image-receiving material, the porous support preferably has such a surface characteristic that a filtered maximum waviness of not less than 4 $\mu$m is observed in not more than 20 positions among 100 positions which are determined at random on a filtered waviness curve obtained according to JIS-B-0610. Further, a transparent material can be employed as the support of the image-receiving material to obtain a transparent or a projected image.

The image-receiving material is usually prepared by providing the image-receiving layer on the support. The image-receiving layer can be constructed according to the color formation system. In the cases that a polymer image is formed on the image-receiving material and that a dye or pigment is employed as the color image forming substance, the image-receiving material be composed of a simple support.

For example, when a color formation system using a color former and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer preferably contains a polymer as binder. The binder which may be employed in the above-mentioned light-receiving layer is also employable in the image-receiving layer. Further, a polymer having a transmission coefficient of oxygen of not more than $1.0 \times 10^{-11}$ cm$^3$.cm/cm$^2$.sec.cmHg can be used as the binder to protect the color of the image formed on the image-receiving material.

The image-receiving layer can contain a granulated thermoplastic compound to obtain a glossy image. There is no specific limitation with respect to the thermoplastic compound. The thermoplastic compound include known plastic resin and wax. The thermoplastic resin preferably has a glass transition temperature of not more than 200° C. The wax preferably has a melting point of not more than 200° C.

A photopolymerization initiator or a thermalpolymerization initiator can be contained in the image-receiving layer to polymerize the transferred unpolymerized polymerizable compound, so that the obtained image is fixed on the image-receiving layer.

A dye or pigment can be contained in the image-receiving layer for the purpose of entering letters, symbols, frames etc. in the image-receiving layer, or of giving a certain color to the background of the image. Further, the dye or pigment can be also employed for the purpose of making it easy to distinguish the sides of the image-receiving material. In the case that it is possible that the dye or pigment disturbs the image formed on the image-receiving layer, it is preferred that the density of the dye or pigment is low (e.g. reflection density of not higher than 1), or the dye or pigment has a property of being decolored when it is heated or irradiated with light.

Further, when a white pigment, such as titanium dioxide, barium sulfate etc. is contained in the image-receiving layer, the image-receiving layer can function as a white reflection layer. In this case, the white pigment is used in an amount of from 10 g to 100 g based on 1 g of the thermoplastic material.

The above-mentioned dye and pigment can be either uniformly or partially contained in the image-receiving layer. For example, when the support is composed of transparent material, the white pigment can be partially contained in the image-receiving layer to make a part of a reflection image to be transparent. Thus, information of the image which is unnecessary in a transparent image can be entered in the part of the image-receiving layer containing the white pigment as the reflection image.

The image-receiving layer can be composed of two or more layers according to the above-mentioned functions. The thickness of the image-receiving layer preferably ranges from 1 to 100 μm, more preferably from 1 to 20 μm.

A protective layer can be provided on the surface of the image-receiving layer. A layer containing a granulated thermoplastic compound can be also provided on the image-receiving layer.

A layer containing an adhesive and a release paper can be provided in the order on the support of the image-receiving material on the opposite side of the image-receiving layer.

After the image exposure and/or the development process, pressing the light-sensitive material on the image-receiving material to transfer the unpolymerized polymerizable compound to the image-receiving material, a polymer image can be obtained in the image-receiving material. The process for pressing can be carried out in various known manners.

In the case that the light-sensitive layer contains a color image forming substance, the color image forming substance is fixed by polymerization of the polymerizable compound. Then, pressing the light-sensitive material on the image-receiving material to transfer the color image forming substance in unfixed portion, a color image can be produced on the image-receiving material.

After the image is formed on the image-receiving material, the image-receiving material can be heated to polymerize the transferred unpolymerized polymerizable compound. By the above-mentioned process, the obtained image can be improved in the preservability.

Various image recording apparatus can be used for the image-forming method. An example of the apparatus comprises an exposure device for imagewize exposing the light-sensitive material to form a latent image, a heat development device for fixing the area corresponding to the latent image, a transfer device for pressing the developed light-sensitive material on the image-receiving material. Another example of the apparatus comprises an fixing apparatus for irradiating with light, pressing or heating the image-receiving material on which an image has been transferred in addition to the above-mentioned devices.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples, but these examples are by no means understood to restrict the invention.

EXAMPLE 1

Preparation of Silver Halide Emulsion

In 1,200 ml of water were dissolved 25 g of gelatin and 3 g of potassium bromide, and the resulting gelatin solution was kept at 70° C. To the gelatin solution, 600 ml of an aqueous solution containing 117 g of potassium bromide and 600 ml of an aqueous solution containing 0.74 mole of silver nitrate were added simultaneously at the same feed rate over 45 minutes. After 5 minutes, to the resulting mixture was further added 200 ml of an aqueous solution containing 4.3 g of potassium iodide at the same feed rate over 5 minutes. The resulting emulsion was washed with water for desalting, and to the emulsion was added 24 g of gelatin and stirred at 50° C. for 15 minutes to obtain a silver halide emulsion. The yield of the emulsion was 1,000 g.

Preparation of W/O emulsion

In 100 g of trimethylolpropane triacrylate were dissolved 1.2 g of the following copolymer and 15 g of Pargascript Red I-6-B (trade name of Ciba-Geigy).

(Copolymer)

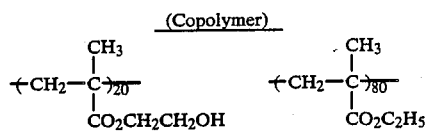

In 18.0 g of the resulting solution was dissolved 0.36 g of a surface active agent (trade name: Nissan Nonion NS 208.5, produced by Nippon Oils & Fats Co., Ltd.), and to the solution was then added a solution in which 1.29 g of the following reducing agent (I), 1.22 g of the following reducing agent (II) and 0.0015 g of the following antifogging agent were dissolved in 4 g of methylene chloride to obtain an oily phase (O).

(Reducing agent (I))

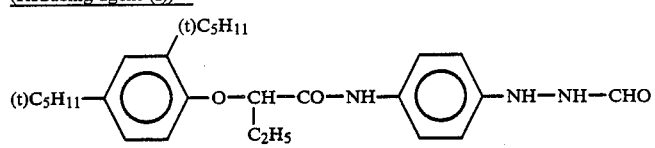

(Reducing agent (II))

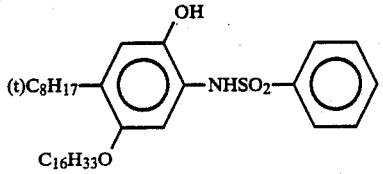

(Antifogging agent)

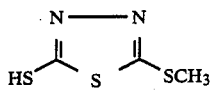

Independently, to 2.0 g of the above-obtained silver halide emulsion was added 0.45 g of a 10% aqueous solution of potassium bromide to obtain an aqueous phase (W).

Further, to the above-obtained oily phase (O) was added the aqueous phase (W), and the mixture was stirred at 15,000 r.p.m. using homogenizer for 5 minutes to obtain a W/O emulsion.

PREPARATION OF LIGHT-SENSITIVE MICROCAPSULE

To a 10% aqueous solution of partial sodium salt of polyvinylbenzene sulfonic acid (trade name: VERSA AGS 1953, produced by National Starch, Corp.) was added a 20% aqueous solution of phosphoric acid, and adjusted to pH 6.0. To 40 g of the aqueous solution was added a mixture of the above-prepared W/O emulsion and 0.9 g of a polyisocyanate compound (trade name: Takenate D110N, available from Takeda Chemical Industries, Ltd.), and the resulting mixture was stirred at 9,000 r.p.m. for 30 minutes using a homogenizer at 40° C. to obtain a W/O/W emulsion which was covered with a shell of a polyurea resin.

Independently, a mixture of 16.1 g of the following melamine derivative, 25.2 g of a 37% aqueous solution of formaldehyde and 70.8 g of water was adjusted to pH 9.0 by adding an aqueous solution of 1N-sodium hydroxide, and the mixture was stirred at 60° C. for 30 minutes to give a transparent melamine derivative-formaldehyde precondensate.

(Melamine derivative)

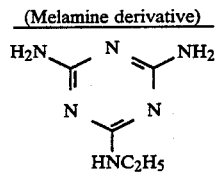

8.7 g of the precondensate was added to the above-obtained W/O/W emulsion. The resulting mixture was then adjusted to pH 6.0 using a 20% aqueous solution of phosphoric acid, and then the mixture was stirred for 90 minutes at 65° C. to obtain a dispersion of microcapsules having shells containing a melamine derivative-formaldehyde resin.

PREPARATION OF LIGHT-SENSITIVE MATERIAL

In 160 g of a 1% aqueous solution of gelatin was dispersed 40 g of the following base precursor using a Dynomill dispersing device to prepare a dispersion of base precursor particles.

(Base precursor)

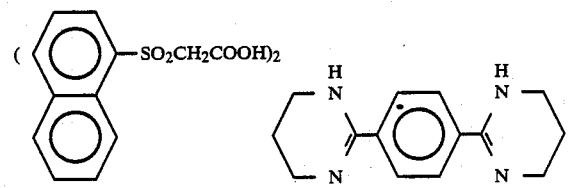

To 30 g of the above-obtained microcapsule dispersion were added 4.0 g of a 5% aqueous solution of Emalex NP-8 (trade name of Nippon Emulsion Co., Ltd.), 17.0 g of the above-prepared base precursor dispersion, 4.3 g of a 20% solution of the following hot-melt solvent (I) and 3.0 g of a 20% solution of the following hot-melt solvent (II), to prepare a coating solution for the formation of a light-sensitive layer.

(Hot-melt solvent (I))

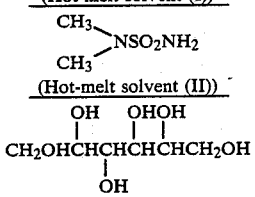

(Hot-melt solvent (II))

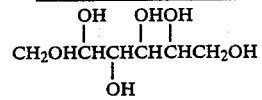

The coating solution was coated on a polyethylene terephthalate film having a thickness of 100 μm using a wire bar (#40), and the coated layer was dried at approx. 40° C. for one hour to obtain a light-sensitive material.

EXAMPLES 2-3

Light-sensitive materials were prepared in the same manner as described in Example 1 except for using the following 5-functional compound (melamine derivative) and a 37% aqueous solution of formaldehyde (formalin) in the amounts set forth in Table 1.

(melamine derivative)

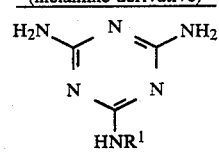

In Table 1, the amounts of the melamine derivative and formalin used in Example 1 are also set forth.

TABLE 1

| | Melamine Derivative | | Formalin |
|---|---|---|---|
| | R¹ | Amount (g) | Amount (g) |
| Example 1 | —C$_2$H$_5$ | 16.1 | 25.2 |
| Example 2 | —C$_4$H$_9$ | 19.1 | 25.2 |
| Example 3 | 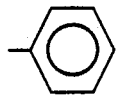 | 21.2 | 33.6 |

EXAMPLES 4-9

Light-sensitive materials were prepared in the same manner as described in Example 1 except for using the following 4-functional compound (melamine derivative) and a 37% aqueous solution of formaldehyde (formalin) in the amounts set forth in Table 2.

(melamine derivative)

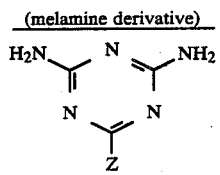

TABLE 2

| | Melamine Derivative | | Formalin |
|---|---|---|---|
| | Z | Amount (g) | Amount (g) |
| Example 4 | —H | 11.6 | 18.5 |
| Example 5 | —CH$_3$ | 13.1 | 17.9 |
| Example 6 | —⌬ (phenyl) | 19.6 | 33.6 |
| Example 7 | —CH$_2$—⌬ (benzyl) | 21.1 | 33.6 |
| Example 8 | —OCH$_3$ | 14.8 | 18.5 |
| Example 9 | —N(CH$_3$)$_2$ | 16.1 | 26.9 |

COMPARISON EXAMPLE 1

The procedures of Example 1 were repeated except for using melamine instead of the melamine derivative to prepare a light-sensitive material for comparison.

Evaluation of Light-Sensitive Material

The light-sensitive materials obtained in the above examples were evaluated on the variation of image density (minimum density) depending on the heat-developing time and the firmness of microcapsules according to the tests described hereinafter using an image-receiving material prepared in the following manner.

Preparation of Image-Receiving Material

To 125 g of water was added 11 g of a 40% aqueous solution of sodium hexametaphosphate, and were further added 34 g of zinc 3,5-di-α-methylbenzylsalicylate and 82 g of a 55% slurry of calcium carbonate, followed by coarsely dispersing in a mixer. The coarse dispersion was then finely dispersed in Dynomill dispersing device. To 200 g of the resulting dispersion were added 6 g of 50% latex of SBR (styrene-butadiene rubber) and 55 g of an 8% aqueous solution of polyvinyl alcohol, and the resulting mixture was made uniform. The mixture was then evenly coated on a paper having basis weight of 80 g/m² to give a layer having a wet thickness of 30 μm and dried to obtain an image-receiving material.

Evaluation on Variation of Image Density

Each of the light-sensitive materials was imagewise exposed to light using a tungsten lamp at 2,000 lux for 1 second through a filter having maximum density of 4.0 and minimum density of 0.1, and then heated on hot plate at 125° C. for 30 seconds. Each of the exposed and heated light-sensitive materials was then combined with the above-obtained image-receiving material and passed through a press roller at pressure of 500 kg/cm² to obtain a magenta positive image on the image-receiving material. The minimum density (D min) of the obtained magenta positive image was measured using a reflection densitometer.

The results are set forth in Table 3, in which each value of the minimum densities corresponds to each heating time (heat-developing time) also set forth in the table.

TABLE 3

| | Variation of Minimum Density Heating Time (sec.) | | | | |
|---|---|---|---|---|---|
| | 10 | 15 | 20 | 25 | 30 |
| Example 1 | 1.18 | 0.79 | 0.21 | 0.09 | 0.09 |
| Example 2 | 1.19 | 0.94 | 0.24 | 0.13 | 0.10 |
| Example 3 | 1.15 | 0.77 | 0.20 | 0.11 | 0.10 |
| Example 4 | 1.20 | 1.02 | 0.31 | 0.15 | 0.09 |
| Example 5 | 1.20 | 0.97 | 0.28 | 0.15 | 0.08 |
| Example 6 | 1.15 | 0.70 | 0.19 | 0.09 | 0.08 |
| Example 7 | 1.13 | 0.67 | 0.16 | 0.09 | 0.08 |
| Example 8 | 1.20 | 0.87 | 0.23 | 0.12 | 0.10 |
| Example 9 | 1.16 | 0.73 | 0.20 | 0.12 | 0.09 |
| Com. Ex. 1 | 1.25 | 1.22 | 1.08 | 0.08 | 0.20 |

As is apparent from the results in Table 3, in the light-sensitive materials using microcapsules of the present invention which were prepared using melamine derivatives of less functional groups, the base rapidly permeated in the heating procedure and the development was completed for a short period of time.

Evaluation on Firmness of Microcapsule

Each of the light-sensitive materials obtained in Example 2 and Comparison Example 1 combined with the image-receiving material was passed through a press roller at various pressures to obtain a magenta positive image on the image-receiving material. The maximum density (D max) of the obtained image was measured using a reflection densitometer.

The results are set forth in Table 4.

TABLE 4

| | Variation of Maximum Density Pressure of Press Roller (kg/cm²) | | | |
|---|---|---|---|---|
| | 50 | 100 | 250 | 500 |
| Example 2 | 0.21 | 0.30 | 0.59 | 1.47 |
| Com. Ex. 1 | 0.12 | 0.19 | 0.38 | 1.26 |

As is apparent from the results in Table 4, in the light-sensitive material (Example 2) using microcapsules of the present invention which were prepared using melamine derivative of less functional group, the microcapsules were provided with high firmness at room temperature.

EXAMPLE 10

Preparation of Light-Sensitive Microcapsule

A silver halide emulsion and a W/O emulsion were prepared in the same manners as described in Example 1.

To a 10% aqueous solution of partial sodium salt of polyvinylbenzene sulfonic acid (trade name: VERSA AGS 1953, produced by National Starch, Co.) was added a 20% aqueous solution of phosphoric acid, and adjusted to pH 6.0. To 40 g of the aqueous solution was added a mixture of the above-prepared W/O emulsion and 0.9 g of a polyisocyanate compound (trade name: Takenate D110N, available from Takeda Chemical Industries, Ltd.), and the resulting mixture was stirred at 9,000 r.p.m. for 30 minutes using a homogenizer at 40° C. to obtain a W/O/W emulsion which was covered with a shell made of polyurea resin.

Independently, a mixture of 13.2 g of melamine, 21.6 g of a 37% aqueous solution of formaldehyde and 70.8 g of water was stirred at 60° C. for 30 minutes to give a transparent melamine-formaldehyde precondensate (A).

Separately, a mixture of 19.1 g of the following melamine derivative, 25.2 g of a 37% aqueous solution of formaldehyde and 70.8 g of water was adjusted to pH 9.0 by adding an aqueous solution of 1N-sodium hydroxide, and the mixture was stirred at 60° C. for 30 minutes to give a transparent melamine derivative-formaldehyde precondensate (B).

(Melamine derivative)

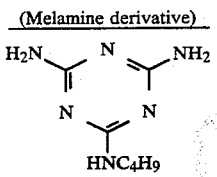

To the above-obtained W/O/W emulsion were added 7.0 g of the precondensate (A) and 2.1 g of the precondensate (B). The resulting mixture was then adjusted to pH 6.0 using a 20% aqueous solution of phosphoric acid, and then the mixture was stirred for 90 minutes at 65° C. to obtain a dispersion of microcapsules having a composite shell containing a melamine-formaldehyde resin and a melamine derivative-formaldehyde resin.

Preparation of Light-Sensitive Material

A light-sensitive material of the present invention was prepared in the same manner as described in Example 1 except for using the above-prepared microcapsule dispersion.

EXAMPLES 11–13

The procedures of Example 10 were repeated except for using the precondensates (A) and (B) in the amounts set forth in Table 5, to prepare light-sensitive materials of the present invention. In Table 5, the amounts of the precondensates used in Example 10 are also set forth.

TABLE 5

| | Amount of Precondensate (g) | |
|---|---|---|
| | (A) | (B) |
| Example 10 | 7.0 | 2.1 |
| Example 11 | 5.2 | 4.2 |
| Example 12 | 3.5 | 6.4 |
| Example 13 | 1.7 | 8.5 |

Evaluation of Light-Sensitive Material

The light-sensitive materials obtained in Examples 10 to 13 were evaluated on the variation of minimum image density depending on the heat-developing time and the firmness of the microcapsule according to the aforementioned tests.

The results are set forth in Table 6 and Table 7.

TABLE 6

| | Variation of Minimum Density Heating Time (sec.) | | | | |
|---|---|---|---|---|---|
| | 10 | 15 | 20 | 25 | 30 |
| Example 10 | 1.24 | 1.17 | 0.87 | 0.31 | 0.15 |
| Example 11 | 1.23 | 1.09 | 0.50 | 0.21 | 0.11 |
| Example 12 | 1.21 | 1.06 | 0.38 | 0.19 | 0.11 |
| Example 13 | 1.21 | 0.93 | 0.30 | 0.15 | 0.10 |

As is apparent from the results in Table 6, in the light-sensitive materials using microcapsules of the present invention which were prepared by co-condensation of melamine and melamine derivative, the base rapidly permeated in the heating procedure and the development completed for a short period of time.

TABLE 7

| | Variation of Maximum Density Pressure of Press Roller (kg/cm$^2$) | | | |
|---|---|---|---|---|
| | 50 | 100 | 250 | 500 |
| Example 10 | 0.11 | 0.21 | 0.45 | 1.32 |
| Example 11 | 0.13 | 0.21 | 0.44 | 1.38 |
| Example 12 | 0.12 | 0.24 | 0.50 | 1.45 |
| Example 13 | 0.17 | 0.31 | 0.52 | 1.44 |

As is apparent from the results in Table 7, in the light-sensitive materials (Examples 10 to 13) using microcapsules of the present invention which were prepared by co-condensation of melamine and melamine derivative, the microcapsules were provided with high firmness at room temperature.

EXAMPLE 14

Preparation of Light-Sensitive Microcapsule

A silver halide emulsion and a W/O emulsion were prepared in the same manner as described in Example 1.

Using the silver halide emulsion and the W/O emulsion, a dispersion containing light-sensitive microcapsules having a melamine derivative-formaldehyde resin shell was prepared in the same manner as described in Example 1 except that Takenate D110N (polyisocyanate compound) was not used.

Preparation of Light-Sensitive Material

A light-sensitive material of the present invention was prepared in the same manner as described in Example 1 except that the above-obtained dispersion was replaced for the microcapsule dispersion of Example 1.

EXAMPLES 15–22

Preparation of Light-Sensitive Microcapsule

Dispersions of microcapsules having a shell of melamine derivative-formaldehyde resin were prepared in the same manner as described in Example 14 except for using the same 5-functional compounds (melamine derivative) as those used in Examples 2 and 3 and formalin in amounts set forth in Table 1 and using the same 4-functional compounds (melamine derivative) as those used in Examples 4 to 9 and formalin in the amounts set forth in Table 2.

Preparation of Light-Sensitive Material

Light-sensitive materials of the present invention were prepared in the same manner as described in Example 14 except that the above-obtained dispersions were replaced for the microcapsule dispersion of Example 14.

Evaluation of Light-Sensitive Material

The light-sensitive materials obtained in Examples 14 to 22 were evaluated on the variation of minimum image density depending on the heat-developing time according to the aforementioned test.

The results are set forth in Table 8.

TABLE 8

| | Variation of Minimum Density Heating Time (sec.) | | | | |
|---|---|---|---|---|---|
| | 10 | 15 | 20 | 25 | 30 |
| Example 14 | 1.17 | 0.75 | 0.25 | 0.09 | 0.08 |
| Example 15 | 1.21 | 0.80 | 0.22 | 0.13 | 0.09 |
| Example 16 | 1.17 | 0.81 | 0.23 | 0.11 | 0.11 |
| Example 17 | 1.19 | 0.98 | 0.29 | 0.14 | 0.10 |
| Example 18 | 1.22 | 1.00 | 0.31 | 0.16 | 0.08 |
| Example 19 | 1.16 | 0.68 | 0.19 | 0.10 | 0.08 |
| Example 20 | 1.17 | 0.70 | 0.15 | 0.09 | 0.08 |
| Example 21 | 1.16 | 0.85 | 0.22 | 0.12 | 0.08 |
| Example 22 | 1.18 | 0.75 | 0.21 | 0.11 | 0.09 |

As is apparent from the results in Table 8, in the light-sensitive materials using microcapsules of the present invention which had melamine derivative-formaldehyde resin shells, the base rapidly permeated in the heating procedure and the development was completed for a short period of time.

EXAMPLE 23

Preparation of Light-Sensitive Microcapsule

A silver halide emulsion and a W/O emulsion were prepared in the same manners as described in Example 1.

To a 10% aqueous solution of partial sodium salt of polyvinylbenzene sulfonic acid (trade name: VERSA AGS 1953, produced by National Starch, Co.) was added a 20% aqueous solution of phosphoric acid, and adjusted to pH 6.0. To 40 g of the aqueous solution was added the above-prepared W/O emulsion, and the resulting mixture was stirred at 9,000 r.p.m. for 10 minutes using a homogenizer at 40° C. to obtain a W/O/W emulsion.

Independently, a mixture of 27.7 g of the following melamine derivative (2), 32.6 g of a 37% aqueous solution of formaldehyde and 126 g of water was adjusted to pH 9.0 by adding an aqueous solution of 1N-sodium hydroxide, and the mixture was stirred at 60° C. for 30 minutes to give a transparent melamine derivative-formaldehyde precondensate.

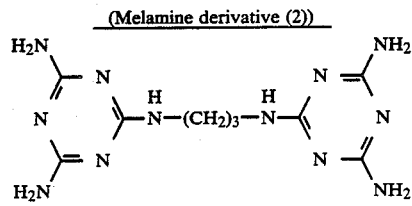
(Melamine derivative (2))

The number of the melamine derivative corresponds to that of the melamine derivative exemplified in "the detailed description of the invention" described hereinbefore, and the same in the later examples.

8.7 g of the precondensate was added to the above-obtained W/O/W emulsion. The resulting mixture was then adjusted to pH 6.0 using a 20% aqueous solution of phosphoric acid, and then the mixture was stirred for 90 minutes at 60° C. to obtain a dispersion of microcapsules having shells containing a melamine derivative-formaldehyde resin.

Preparation of Light-Sensitive Material

In 160 g of a 1% aqueous solution of gelatin was dispersed 40 g of the following base precursor using a Dynomill dispersing device to prepare a dispersion of base precursor particles.

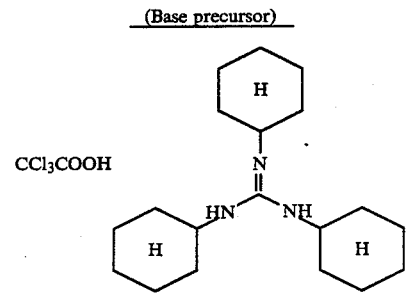
(Base precursor)

To 30 g of the above-obtained microcapsule dispersion were added 4.0 g of a 5% aqueous solution of Emalex NP-8 (trade name of Nippon Emulsion Co., Ltd.), 15.0 g of the above-prepared base precursor dispersion, 4.3 g of a 20% solution of the hot-melt solvent (I) and 3.0 g of a 20% solution of the hot-melt solvent (II) (both hot melt solvents were the same as those used in Example 1), to prepare a coating solution for the formation of a light-sensitive layer.

The coating solution was coated on a polyethylene terephthalate film having a thickness of 100 μm using a wire bar (#40), and the coated layer was dried at approx. 40° C. for one hour to obtain a light-sensitive material.

EXAMPLES 24–29

Light-sensitive materials were prepared in the same manner as described in Example 23 except for using the following compounds (melamine derivative) and varying the amounts of said compounds, a 37% aqueous solution of formaldehyde (formalin) and water to those set forth in Table 9. In Table 9, the amounts of melamine derivative (2), formalin and water used in Example 23 are also set forth.

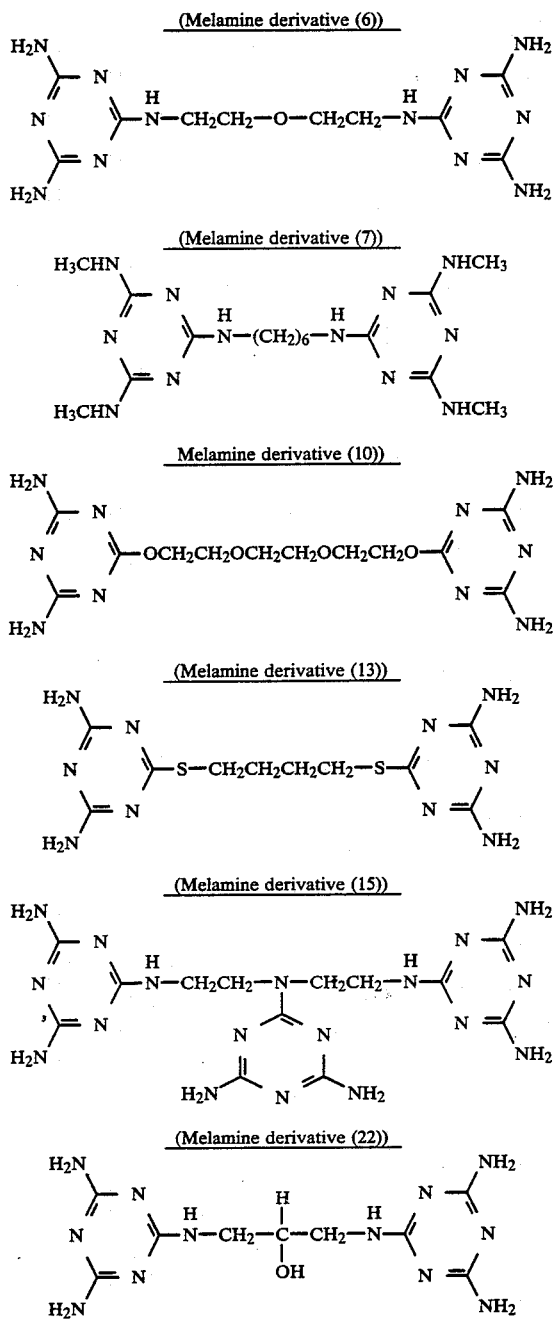

TABLE 9

| | Melamine Derivative | | Formalin | Water |
|---|---|---|---|---|
| | Kind | Amount (g) | Amount (g) | Amount (g) |
| Example 23 | (2) | 26.7 | 32.6 | 126 |
| Example 24 | (6) | 29.4 | 32.6 | 123 |
| Example 25 | (7) | 35.6 | 32.6 | 117 |
| Example 26 | (10) | 33.6 | 32.6 | 119 |
| Example 27 | (13) | 31.1 | 82.6 | 121 |
| Example 28 | (15) | 39.2 | 48.9 | 97 |
| Example 29 | (22) | 28.1 | 32.6 | 124 |

COMPARISON EXAMPLE 2

A light-sensitive material for comparison was prepared in the same manner as described in Example 23 except for using melamine (instead of the melamine derivative), a 37% aqueous solution of formaldehyde (formalin) and water in the amounts of 23 g, 38 g, and 124 g, respectively.

Evaluation of Light-Sensitive Material

The light-sensitive materials obtained in Examples 23 to 29 and Comparison Example 2 were evaluated on the variation of minimum image density depending on the heat-developing time according to the aforementioned test.

The results are set forth in Table 10.

TABLE 10

| | Variation of Minimum Density Heating Time (sec.) | | | | |
|---|---|---|---|---|---|
| | 10 | 15 | 20 | 25 | 30 |
| Example 23 | 1.21 | 0.80 | 0.44 | 0.20 | 0.10 |
| Example 24 | 1.22 | 0.77 | 0.40 | 0.21 | 0.08 |
| Example 25 | 1.20 | 0.88 | 0.39 | 0.21 | 0.11 |
| Example 26 | 1.20 | 1.73 | 0.32 | 0.18 | 0.08 |
| Example 27 | 1.25 | 0.74 | 0.31 | 0.18 | 0.08 |
| Example 28 | 1.22 | 0.89 | 0.50 | 0.24 | 0.13 |
| Example 29 | 1.24 | 0.81 | 0.38 | 0.19 | 0.10 |
| Com. Ex. 2 | 1.28 | 1.25 | 1.19 | 0.82 | 0.57 |

As is apparent from the results in Table 10, in the light-sensitive materials using microcapsules of the present invention which were prepared using melamine derivatives, the base rapidly permeated in the heating procedure and the development was completed for a short period of time.

EXAMPLE 30

Preparation of Light-Sensitive Microcapsule

A silver halide emulsion and a W/O emulsion were prepared in the same manners as described in Example 1.

To 10% aqueous solution of partial sodium salt of polyvinylbenzene sulfonic acid (trade name: VERSA AGS 1953, produced by National Starch, Co.) was added 20% aqueous solution of phosphoric acid, and adjusted to pH 6.0. To 40 g of the aqueous solution was added the above-prepared W/O emulsion, and the resulting mixture was stirred at 9,000 r.p.m. for 30 minutes using a homogenizer at 40° C. to obtain a W/O/W emulsion.

Independently, a mixture of 23 g of melamine, 38 g of a 37% aqueous solution of formaldehyde and 124 g of water was stirred at 60° C. for 30 minutes to give a transparent melamine-formaldehyde precondensate (C).

Separately, a mixture of 33.6 g of the melamine derivative (10) used in Example 26, 32.6 g of a 37% aqueous solution of formaldehyde and 119 g of water was adjusted to pH 9.5 by adding an aqueous solution of 1N-sodium hydroxide, and the mixture was stirred at 60° C. for 30 minutes to give a transparent melamine derivative-formaldehyde precondensate (D).

To the above-obtained W/O/W emulsion were added 1.74 g of the precondensate (C) and 6.96 g of the precondensate (D). The resulting mixture was then adjusted to pH 6.0 using a 20% aqueous solution of phosphoric acid, and then the mixture was stirred for 90 minutes at 60° C. to obtain a dispersion of microcapsules having co-condensation shells comprising a melamine-formaldehyde resin and a melamine derivative-formaldehyde resin.

Preparation of Light-Sensitive Material

A light-sensitive material of the present invention was prepared in the same manner as described in Example 23 except for using the above-prepared microcapsul dispersion.

EXAMPLES 31-33

The procedures of Example 30 were repeated except for using the precondensates (C) and (D) in the amounts set forth in Table 11, to prepare light-sensitive materials of the present invention. In Table 11, the amounts of the precondensates used in Example 30 were also set forth.

TABLE 11

| | Amount of Precondensate (g) | |
|---|---|---|
| | (C) | (D) |
| Example 30 | 1.74 | 6.96 |
| Example 31 | 3.48 | 5.22 |
| Example 32 | 5.22 | 3.48 |
| Example 33 | 6.96 | 1.74 |

Evaluation of light-Sensitive Material

The light-sensitive materials obtained in Examples 30 to 33 were evaluated on the variation of minimum image density depending on the heat-developing time according to the aforementioned test.

The results are set forth in Table 12.

TABLE 12

| | Variation of Minimum Density Heating Time (sec.) | | | | |
|---|---|---|---|---|---|
| | 10 | 15 | 20 | 25 | 30 |
| Example 30 | 1.20 | 0.76 | 0.37 | 0.20 | 0.11 |
| Example 31 | 1.22 | 0.81 | 0.40 | 0.20 | 0.13 |
| Example 32 | 1.22 | 0.85 | 0.44 | 0.30 | 0.16 |
| Example 33 | 1.24 | 0.96 | 0.87 | 0.39 | 0.16 |

As is apparent from the results in Table 12, in the light-sensitive materials using microcapsules of the present invention which were prepared by co-condensation of melamine and melamine derivative, the base rapidly permeated in the heating procedure and the development was completed for a short period of time.

We claim:

1. A light-sensitive microcapsule having a core material which contains a silver halide and an ethylenically unsaturated polymerizable compound, said core material being enclosed in a shell comprising a melamine derivative-aldehyde resin produced from formaldehyde and a melamine compound containing a 2-5 functional melamine derivative of the following formula (I) or a melamine derivative of the following formula (II) in a amount of at least 10 wt.%:

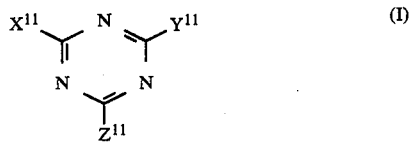

in which each of $X^{11}$, $Y^{11}$ and $Z^{11}$ independently is a group selected from the group consisting of an amino group and a substituted amino group of $-NHR^{11}$ or $-NR^{12}R^{13}$ wherein $R^{12}$ and $R^{13}$ which are the same or different from each other, represent a hydrogen atom an alkyl group, an alkoxy group, a phenyl group, a benzyl group, an alkoxycarbonyl group, an alkoxysulfonyl group, a glucoside group, a cyclic lactim group, a nitro group, a pyrrolyl group which is inert to an aldehyde;

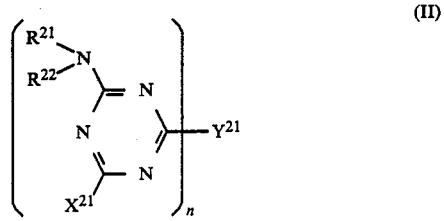

in which each of $R^{21}$ and $R^{22}$ is one atom or one group selected from the group consisting of a hydrogen atom, an alkyl group, an aryl group, a cycloalkyl group and an aralkyl group, provided that one of $R^{21}$ and $R^{22}$ is a hydrogen atom; $X^{21}$ is $-NR^{23}R^{24}$ or $-OR^{25}$ wherein each of $R^{23}$, $R^{24}$ and $R^{25}$ has the same meaning as that for $R^{21}$; $Y^{21}$ is an organic linking group such that the number of atoms linking any two sets of the triazine rings is at least four; n is an integer of 2 to 4; and each of the above groups may have one or more substituents.

2. The light-sensitive microcapsule as claimed in claim 1, wherein said melamine derivative is a tetrafunctional guanamine.

3. The light-sensitive microcapsule as claimed in claim 1, where said melamine derivative has the formula (I) in which each of $R^{11}$, $R^{12}$ and $R^{13}$ is a group selected from the group consisting of an alkyl group having 1-6 carbon atoms, phenyl, an alkoxy group, an alkoxycarbonyl group and an alkoxysulfonyl group.

4. The light-sensitive microcapsule as claimed in claim 1, wherein said melamine compound contains the melamine derivative of the formula (I) in an amount of at least 50 wt. %.

5. The light-sensitive microcapsule as claimed in claim 1, wherein said microcapsule has a composite shell having an inner shell of polyurea resin or polyurethane resin.

6. The light-sensitive microcapsule as claimed in claim 1, wherein said core material further contains a reducing agent.

7. The light-sensitive microcapsule as claimed in claim 1, wherein said melamine derivative has the formula (II) and said linking group of $Y^{21}$ contains at least two atoms selected from the group consisting of nitrogen, oxgen and sulfur, said atoms being attached to each of the triazine groups.

8. The light-sensitive microcapsule as claimed in claim 1, wherein said melamine derivative has the formula (II) in which $X^{21}$ is $-NR^{23}R^{24}$; n is 2; and $Y^{21}$ is an organic linking group in which the number of atoms linking the two triazine rings is not more than 14.

9. The light-sensitive microcapsule as claimed in claim 1, wherein said melamine derivative has the formula (II) in which each of $R^{21}$, $R^{22}$, $R^{23}$ and $R^{24}$ is hydrogen.

10. The light-sensitive microcapsule as claimed in claim 1, wherein said melamine compound contains the melamine derivative of the formula (II) in an amount of at least 20 wt. %.

11. A light-sensitive material comprising a support and a light-sensitive layer provided thereon which contains a silver halide, a reducing agent and an ethylenically unsaturated polymerizable compound, at least said polymerizable compound being contained in a microcapsule, wherein said microcapsule has a shell comprising a melamine derivative-aldehyde resin produced from formaldehyde and a melamine compound containing a 2-5 functional melamine derivative of the following formula (I) or a melamine derivative of the following formula (II) in an amount of at least 10 wt. %:

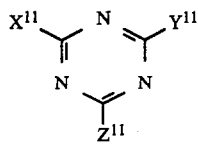

in which each of $X^{11}$, $Y^{11}$ and $Z^{11}$ independently is a group selected from the group consisting of an amino group and a substituted amino group of $-NHR^{11}$ or $-NR^{12}R^{13}$ wherein $R^{12}$ and $R^{13}$ which are the same or different from each other, represent a hydrogen atom, an alkyl group, an alkoxy group, a phenyl group, a benzyl group, and alkoxycarbonyl group, an alkoxysulfonyl group, a glucoside group, a cyclic lactim group, a nitro group, a pyrrolyl group or an idolyl group; each of $R^{11}$, $R^{12}$ and $R^{13}$ is a group which is inert to aldehyde;

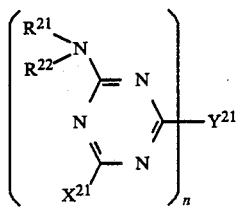

in which each of $R^{21}$ and $R^{22}$ is one atom or one group selected from the group consisting of a hydrogen atom, an alkyl group, an aryl group, a cycloalkyl group and an aralkyl group, provided that one of $R^{21}$ and $R^{22}$ is a hydrogen atom; $X^{21}$ is $-NR^{23}R^{24}$ or $-OR^{25}$ wherein each of $R^{23}$, $R^{24}$ and $R^{25}$ has the same meaning as that for $R^{21}$; $Y^{21}$ is an organic linking group such that the number of atoms linking any two sets of the triazine rings is at least four; n is an integer of 2 to 4; and each of the above groups may have one or more substituents.

12. The light-sensitive material as claimed in claim 11, wherein said melamine derivative is a tetrafunctional guanamine.

13. The light-sensitive material as claimed in claim 11, wherein said melamine derivative has the formula (I) in which each of $R^{11}$, $R^{12}$ and $R^{13}$ is a group selected from the group consisting of an alkyl group having 1-6 carbon atoms, phenyl, an alkoxy group, an alkoxycarbonyl group and an alkoxysulfonyl group.

14. The light-sensitive material as claimed in claim 11, wherein said melamine compound contains the melamine derivative of the formula (I) in an amount of at least 50 wt. %.

15. The light-sensitive material as claimed in claim 11, wherein said microcapsule has a composite shell having an inner shell of polyurea resin or polyurethane resin.

16. The light-sensitive material as claimed in claim 11, wherein said light-sensitive layer further contains a base precursor.

17. The light-sensitive material as claimed in claim 11, wherein said silver halide and reducing agent are contained in the microcapsule.

18. The light-sensitive material as claimed in claim 11, wherein said light-sensitive material is for a heat-developing process.

19. The light-sensitive material as claimed in claim 11, wherein said melamine derivative has the formula (II) and said linking group of $Y^{21}$ contains at least the atoms selected from the group consisting of nitrogen, oxygen and sulfur, said atoms being attached to each of the triazine groups.

20. The light-sensitive material as claimed in claim 11, wherein said melamine derivative has the formula (II) in which $X^{21}$ is $-NR^{23}R^{24}$; n is 2; and $Y^{21}$ is an organic linking group in which the number of atoms linking the two triazine rings is not more than 14.

21. The light-sensitive material as claimed in claim 11, wherein said melamine derivative has the formula (II) in which each of $R^{21}$, $R^{22}$, $R^{23}$ and $R^{24}$ is hydrogen.

22. The light-sensitive material as claimed in claim 11, wherein said melamine compound contains the melamine derivative of the formula (II) in an amount of at least 20 wt. %.

* * * * *